United States Patent [19]

Kos

[11] Patent Number: 4,817,795
[45] Date of Patent: Apr. 4, 1989

[54] ROBOTIC ACCESSIBLE WAFER SHIPPER ASSEMBLY

[75] Inventor: Robert D. Kos, Victoria, Minn.

[73] Assignee: Fluoroware, Inc., Chaska, Minn.

[21] Appl. No.: 163,981

[22] Filed: Mar. 4, 1988

[51] Int. Cl.⁴ ............................................. B65D 85/48
[52] U.S. Cl. ..................................... 206/328; 206/334; 206/587; 206/454; 206/586; 220/324
[58] Field of Search ............... 206/454, 328, 334, 587, 206/586; 220/324

[56] References Cited

U.S. PATENT DOCUMENTS

| | | | |
|---|---|---|---|
| 4,493,418 | 1/1985 | Johnson | 206/454 |
| 4,520,925 | 6/1985 | Johnson | 206/454 |
| 4,588,086 | 5/1986 | Coe | 206/454 |
| 4,669,612 | 6/1987 | Mortensen | 206/454 |
| 4,687,097 | 8/1987 | Mortensen | 206/454 |
| 4,718,552 | 1/1988 | Rossi et al. | 206/454 |

Primary Examiner—Joseph Man-Fu Moy
Attorney, Agent, or Firm—Faegre & Benson

[57] ABSTRACT

A robotic accessible wafer shipper assembly comprises a shipper base, a wafer carrier which supports the disks within the base, and a shipper cover which mates with the base and wafer carrier in latching attachment. The base, carrier and cover are provided with certain specific design features which allow them to be handled, as a completely assembled package, by its constituent components and is assembled and disassembled entirely by robotics.

11 Claims, 7 Drawing Sheets

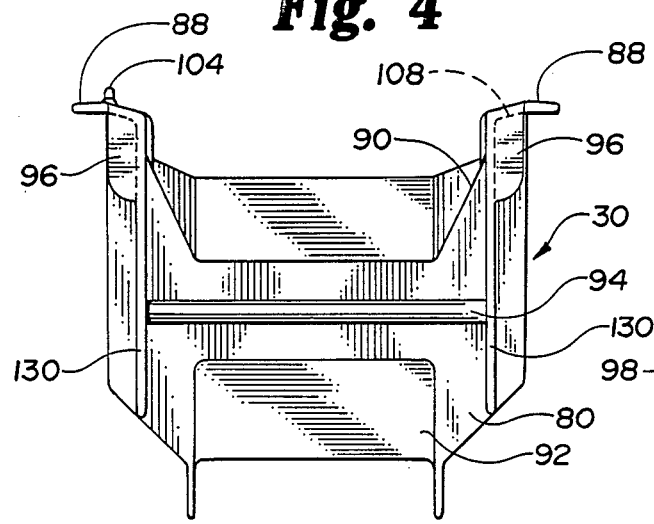
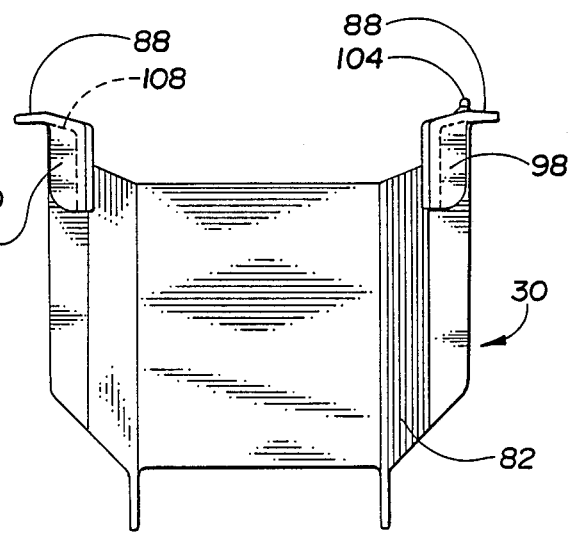
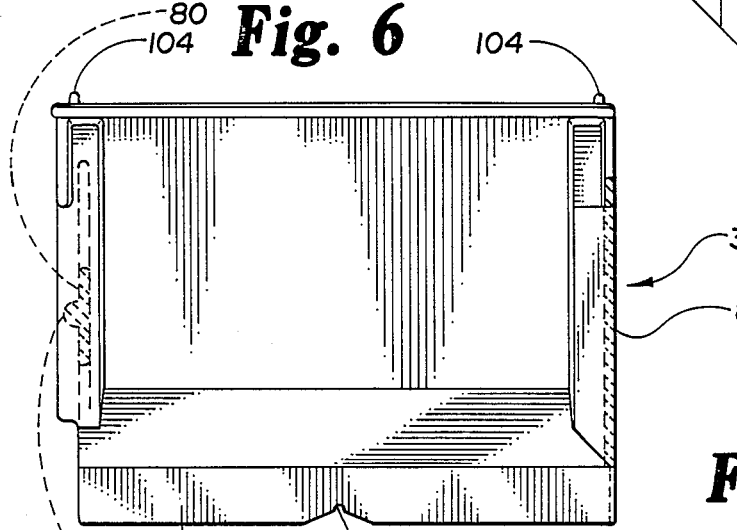
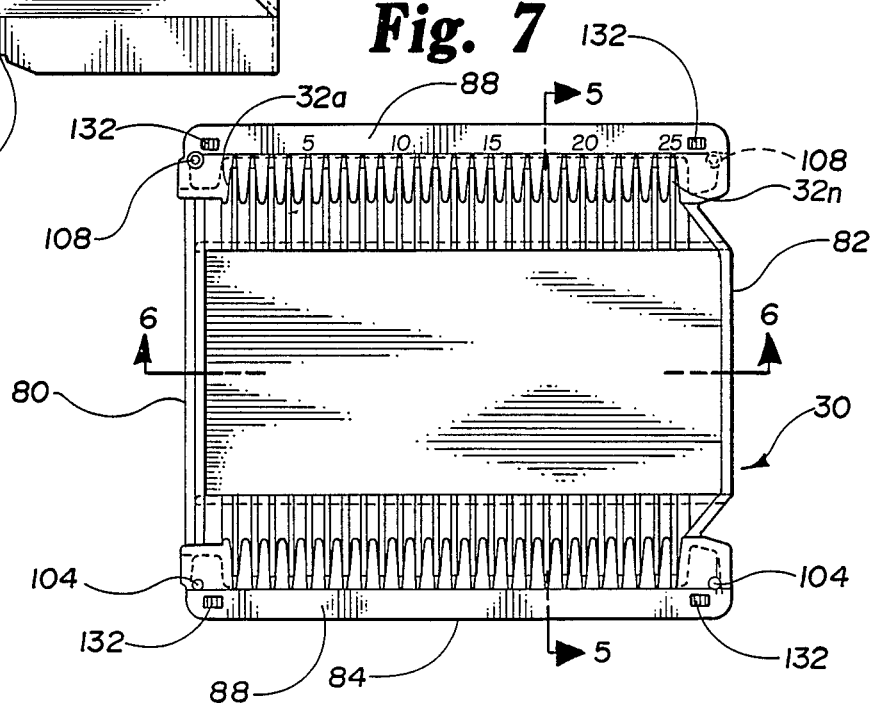

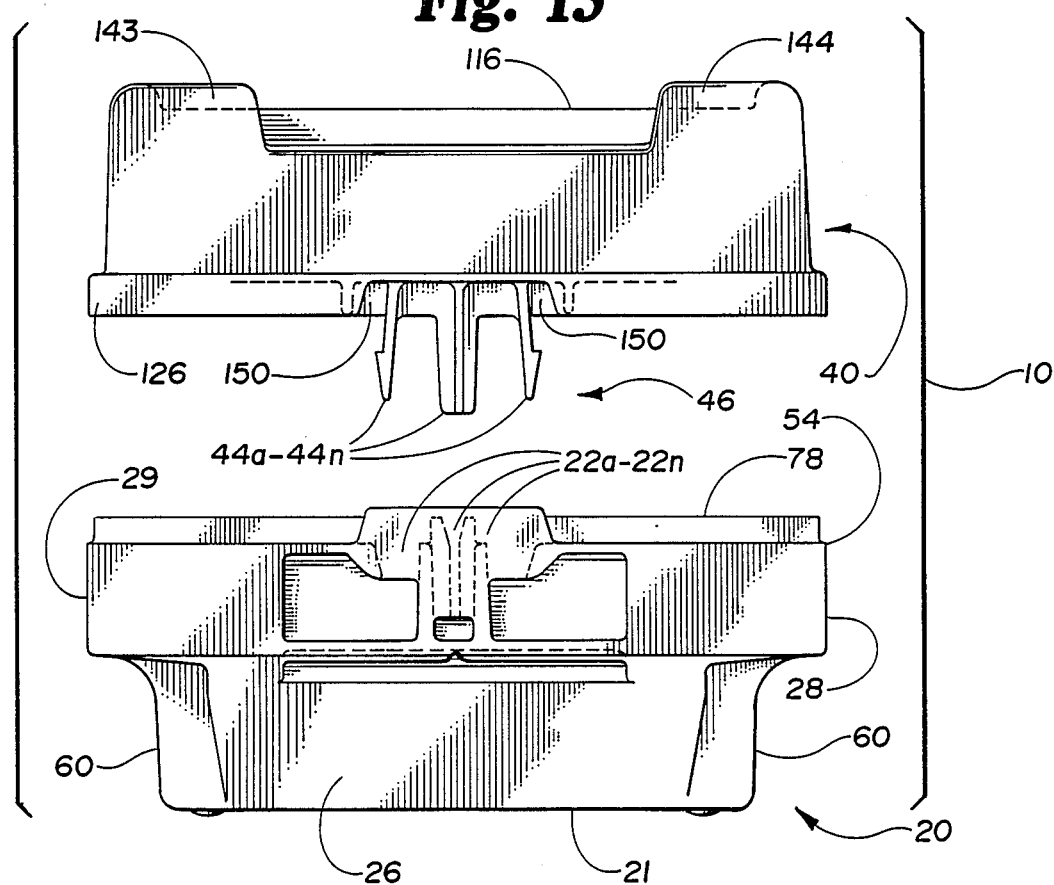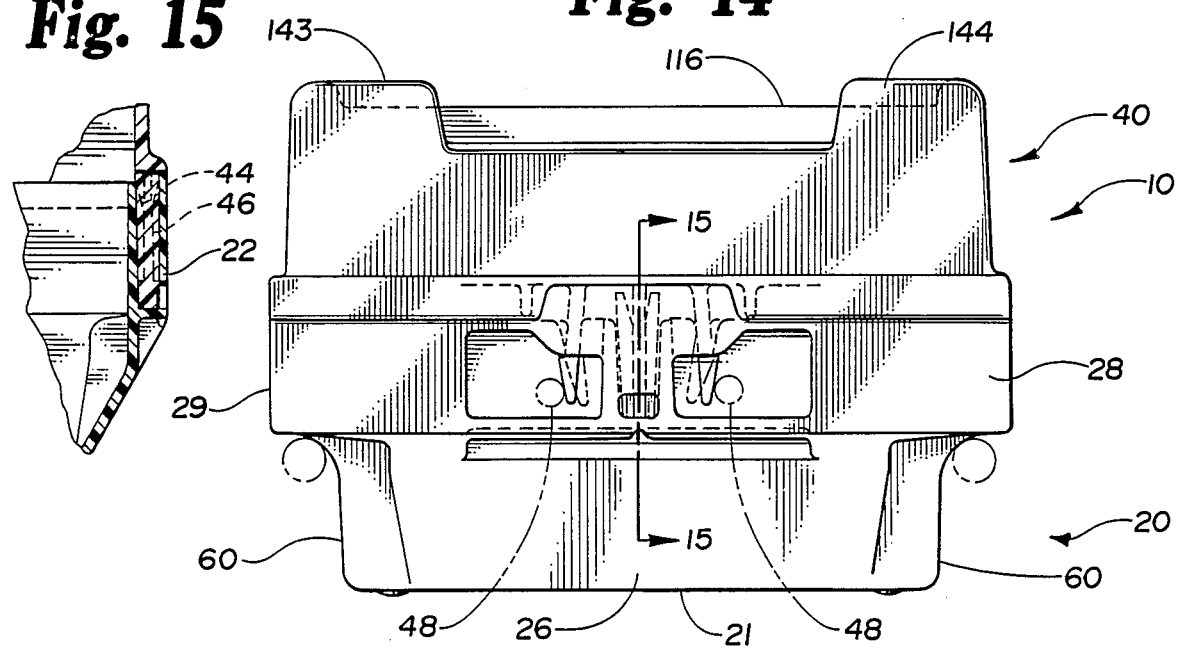

ROBOTIC ACCESSIBLE WAFER SHIPPER ASSEMBLY

BACKGROUND OF THE INVENTION

1. Field of the Invention

This invention relates to a wafer shipper assembly with specific design features which enable the assembly to be easily and efficiently handled by robotics or similar mechanization equipment. More particularly, the present invention provides a wafer shipper assembly whose constituent components, that is, the shipper base, shipper lid and wafer carrier, can all be handled individually, assembled into locking position, unlocked and disassembled entirely by robotic handling equipment.

Moreover, the present invention provides a wafer shipper assembly for the secure transportation and storage of relatively fragile silicon wafers, with the wafers held in an axial alignment by the wafer carrier component within the shipper assembly.

Most conventionally available wafer shipper assemblies fit together to provide a wafer storage and transportation package with certain design features which allow the finally assembled package to be handled by robotics or similar mechanization equipment. However, newly developed techniques for automated wafer placement, transportation, storage and processing within the industry require a wafer package whose constituent components can be robotically handled, not only in their finally assembled form, but individually, that is, assembled, locked, unlocked and disassembled without the time-consuming and costly need for manual intervention. Further, the ability to perform all handling functions involved with a wafer storage and transportation package by robotics will further ensure that the wafers be protected from sources of contamination attendant upon any type of manual handling techniques.

The type of wafers intended to be used with the wafer shipper assembly of this invention are relatively fragile, such as silicon wafers. Although the design of the wafer shipper assembly of this invention may be modified to be suitable for use with more rigid disks, such as optical disks, aluminum computer disks, compact disks and computer memory storage disks, it is primarily designed for use with more relatively fragile silicon semiconductor wafers.

2. Description of the Prior Art

Currently available wafer shipper assembly designs, although providing certain features to allow limited handling by mechanical techniques, are not entirely compatible with robotic handling equipment.

U.S. Pat. No. 4,061,228 shows the use of a carrier within a shipper assembly. It includes a retaining cushion which utilizes upwardly directed ribs for engaging the top wall of the container and includes means on the lower face of a cushion panel to engage the upper edges of the wafers with lugs extending downwardly between the wafers.

U.S. Pat. Nos. 4,248,346 and 4,043,451 are both containers for information wafers which directly contain the wafers in the base without the use of a removable shipper carrier. The containers of these patents use a panel bearing against the inside of the container and the peripheral edges of the wafers to restrain the wafers against movement within the container during transport.

U.S. Pat. No. 4,450,960 discloses a shipping container also using a wafer-containing carrier within a shipper assembly, the disk carrier having an H-bar end wall, mating buttons and curved sides. The package base unit has geometrically configured vertical side and end positioning wall members.

U.S. Pat. No. 4,493,418 discloses a processing carrier having an H-bar end wall construction. The carrier has rounded vertical side members supporting dividers. This patent does not specifically describe the use of this processing carrier in combination with a shipper assembly. U.S. Pat. No. 4,687,097 discloses a processing carrier similar to that shown in U.S. Pat. No. 4,493,418.

U.S. Pat. No. 4,520,925 relates to a shipping container using a wafer-containing carrier within a shipper assembly. The carrier has a rounded downward top edge. Vertical side and end members on the interior side walls of the package between the cover and base interengage the carrier and secure it in place. The only positioning guide or structure for the carrier appears to be located on the bottom wall of the base of the shipper. The row of fingers on the top surface secures the wafers in place with no direct engagement of the top of the carrier. Internal vertical end guides and internal side guides are provided about the package base to engage the carrier.

U.S. Pat. No. 4,669,612 is directed to a processing carrier. The teeth which face inwardly from the sides of the carrier have wash slots which are wider in the lower portion of the carrier, because the lower teeth are narrower than the upper teeth and have a specific angle to provide for free fluid flow about each of the teeth. There is no specific disclosure of the use of this processing carrier in combination with a shipper carrier assembly.

The present invention fills a great unmet need in this handling area by providing a wafer shipper assembly which not only provides a sturdy and convenient package for handling and transportation of information wafers in a safe and secure manner, but also by providing a shipper assembly which can be easily and efficiently handled, as a completely assembled package, by its constituent components and in assembling and disassembling entirely by robotics. None of conventionally available disk shipper assemblies are suitable for exclusive all-encompassing robotic handling.

SUMMARY OF THE INVENTION

According to one embodiment, the wafer shipper assembly according to this invention comprises (1) a shipper base, (2) a wafer carrier which supports the wafers within the shipper base, and (3) a shipper lid which mates with the base and wafer carrier in latching attachment.

The shipper base includes a generally rectangular floor member with four walls, two side walls and two end walls, angled upwardly and slightly outwardly to a generally rectangular peripheral rim. At each corner of the walls of the base, a corner indentation is formed extending generally vertically from the floor to about the mid-height of the base. Correspondingly, recessed corner niches are formed on the exterior of the base, generally conforming to the corner indentations, extending from the floor to about the mid-height of the base. From the rim to about the mid-height of the base, the walls generally conform to the peripheral outline of the rim, so that robotic handling ledges are formed at each of the corners at about the mid-height of the base. Similarly, a bar end indentation is formed in an end wall designed to assure proper one-way alignment of the wafer carrier when it is robotically lowered into position inside the shipper base. There are latch receiving means on opposite walls of the shipper base for robotically actuatable latching engagement with latching means on the shipper cover.

The generally rectangular carrier includes opposing mirror-image side faces, with opposing interiorly extending wafer supporting spacers. An exteriorly projecting bay shaped rear face and an open letter-H configured front face secure the side faces, and vertical edge support wings are angled outwardly from the outer edges of the front and rear faces to provide accessibility for robotic handling equipment and to cooperate with the bar end indentation in the shipper base to assure proper one-way alignment of the carrier when robotically lowered into the base.

The shipper cover includes a generally rectangular top member having a plurality of wafer engaging and supporting means which cooperate with the wafer supporting spacers in the carrier. Four walls are angled downwardly and slightly outwardly from the top member, robotically actuatable latching means are on opposite walls in cooperating alignment with latch receiving means on the shipper base.

The wafer carrier and shipper assembly of this invention has other specific design features suitable for exclusively robotic handling in terms of their individual components, the assembled package and in the assembly, locking, unlocking and disassembly of the carrier and shipper assembly as will be described in greater detail hereinafter.

BRIEF DESCRIPTION OF THE DRAWINGS

The many advantages of the wafer shipper assembly of this invention, and of its constituent components, will be readily appreciated by those of skill in this art by reference to the following detailed description of the preferred embodiment when considered in connection with the accompanying drawings, in which like reference numbers refer to like parts throughout.

FIG. 4 is a left end elevational view of the carrier.

FIG. 5 is a right end elevational view of the carrier.

FIG. 6 is a side elevational view of the carrier.

FIG. 7 is a top plan view of the carrier.

FIG. 13 is an exploded front elevational view of the cover and base.

FIG. 14 is a front elevational view of the cover and base in assembly.

FIG. 15 is a fragmentary section taken along line 15—15 of FIG. 14.

DETAILED DESCRIPTION OF THE INVENTION

Figure 17:
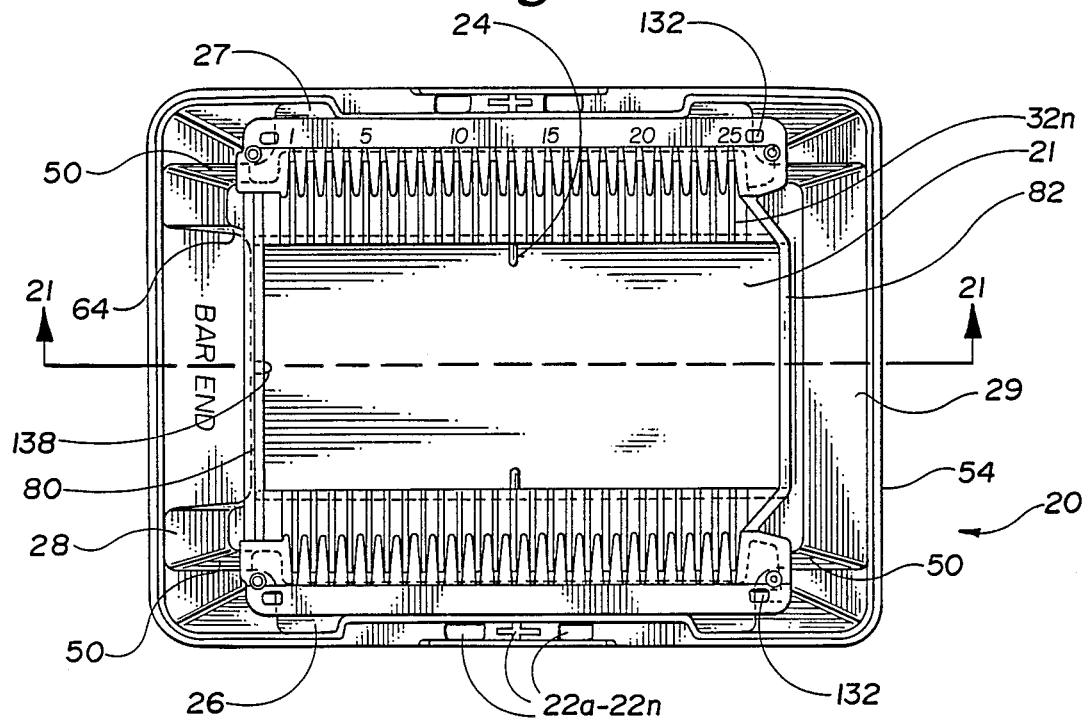
FIG. 17 is a top plan view of the assembly of FIG. 16 with parts cut away.
Figure 18:
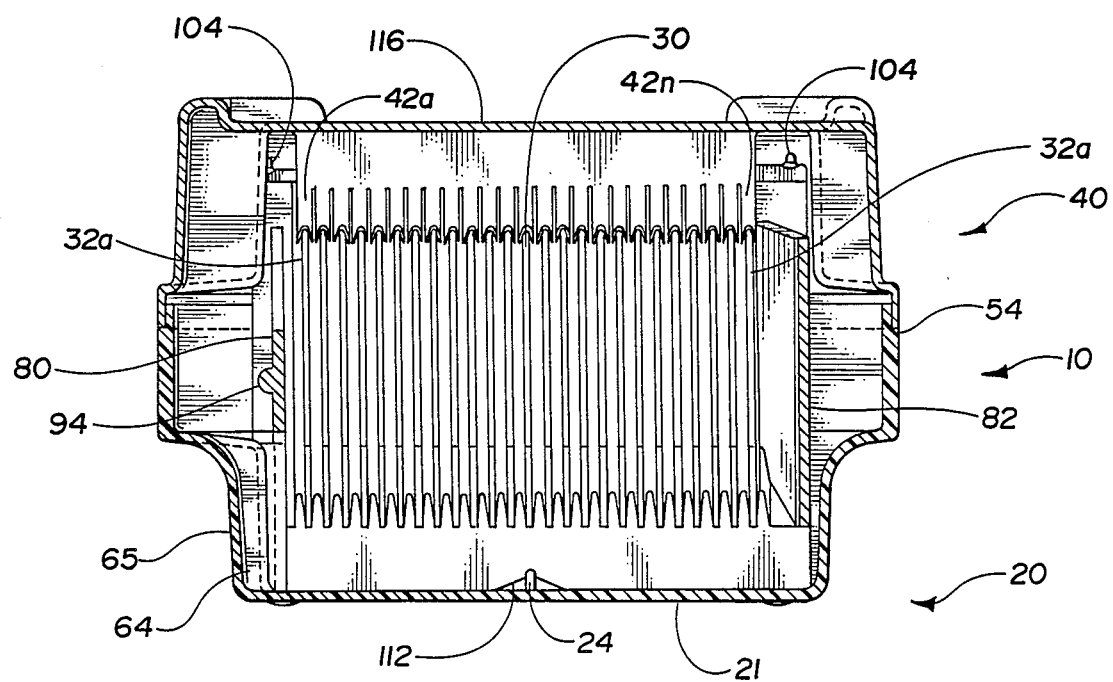
FIG. 18 is a sectional elevation taken along line 18—18 in FIG. 17.

FIGS. 14, 16, 17 and 18 illustrate the wafer carrier and shipper assembly 10 in latching engagement for containing a plurality of wafers (not shown) in upright parallel spaced-apart axial alignment between the respective spacers 32a-32n in the carrier 30 positioned within the shipper base 20. When the wafers are resting between these spacers 32a-32n, the wafers are supported thereby in spaced-apart parallel axial alignment. Shown in FIG. 13, the shipper cover 40 is suspended over the shipper base 20 preparatory to being robotically lowered into latching engagement with the shipper base 20. As shown in FIG. 18, the shipper cover 40 has wafer locating dentate leaves 42a-42n in cooperating alignment with the spacers 32a-32n in the shipper base 20.

The wafer carrier and shipper assembly 10 is shown with the shipper cover 40 in latched engagement with the shipper base 20 in FIGS. 14, 15 and 18. In robotically latching the shipper cover 40 to the shipper base 20, the tines 44a-44n of the latch fork 46 firmly engage the latch slots 22a-22n. Tine locators 48 urge the tines 44a-44n into a slightly biasing distortion as the latch fork 46 enters the latch slots 22a-22n, which serves to maintain the wafer carrier and shipper assembly 10 in firmly latched position during handling and transportation. In FIG. 15, a fragmentary side elevational view of the latching engagement shows the tines 44 of the latch fork 46 firmly engaged within the latch slots 22. It will be immediately apparent to those of skill in the art, that the latching arrangement may equally well be formed with the latch fork 46 located on the shipper base 20 and with the latch slots 22a-22n located on the shipper cover 40. In FIG. 18, a sectional elevation taken along line 18—18 in FIG. 17 shows the wafer carrier spacers 32a-32n in the wafer carrier 30 within the shipper base 20 below and the wafer locating dentate leaves 42a-42n in the shipper cover 40 above, configured so that the spacers 32a-32n cooperate with the dentate leaves 42a-42n to maintain the wafers (not shown) in upright parallel spaced-apart alignment. The design of the wafer locating dentate leaves 42a-42n facilitates secure engagement of the wafers in cooperation with the spacers 32a-32n in the carrier 30 within the shipper base 20 when the shipper cover 40 is robotically lowered into latching engagement with the carrier 30 within the shipper base 20.

Figure 1:
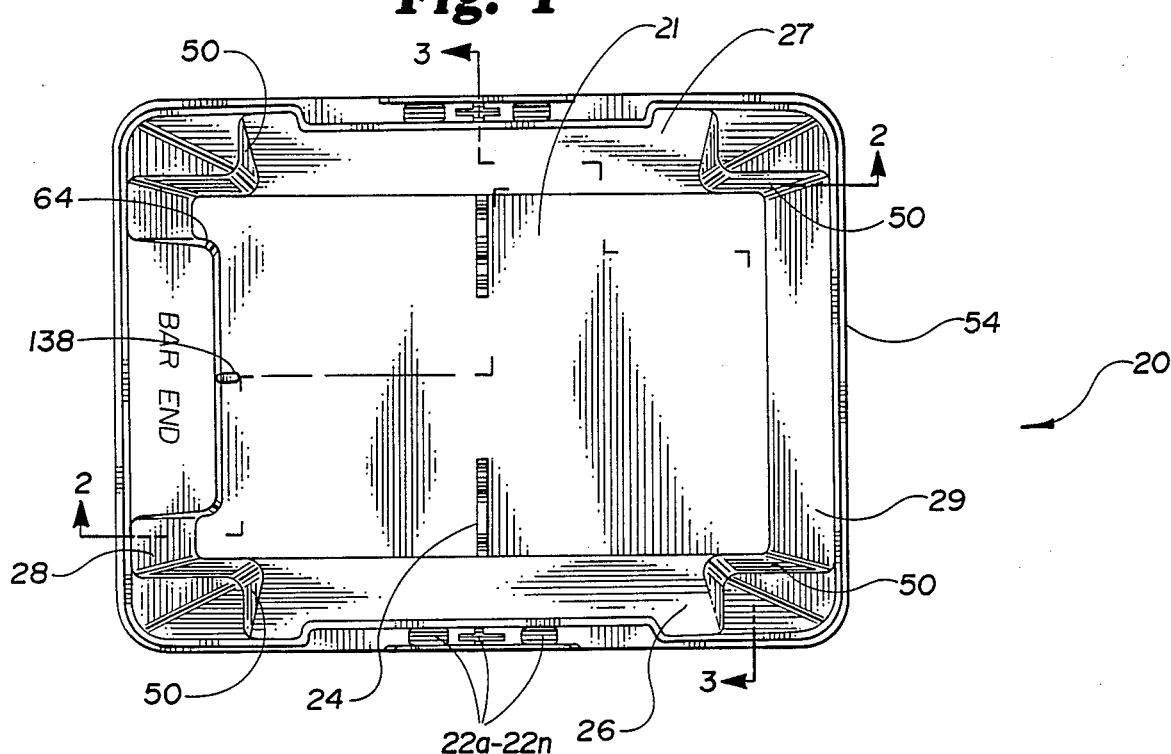
FIG. 1 is a top plan view showing the shipper base.
Figure 2:
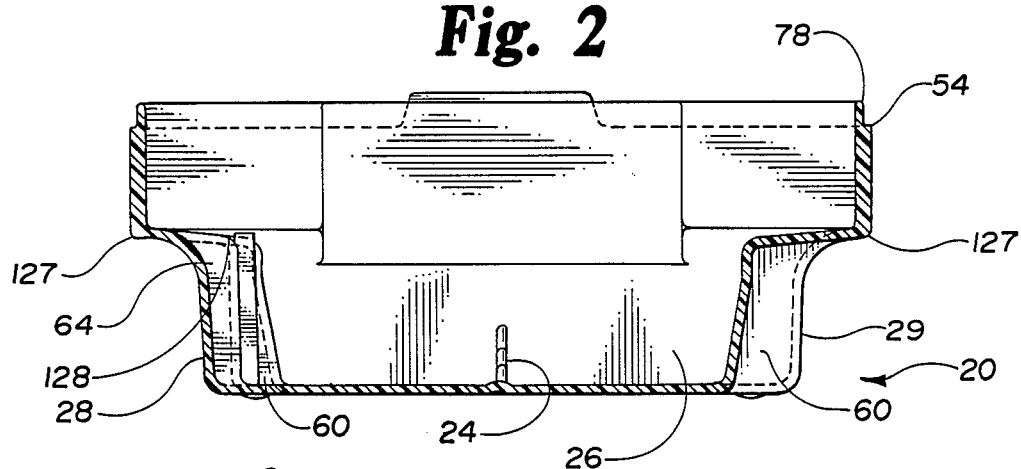
FIG. 2 is a sectional elevation of the shipper base taken along line 2—2 in FIG. 1.
Figure 3:
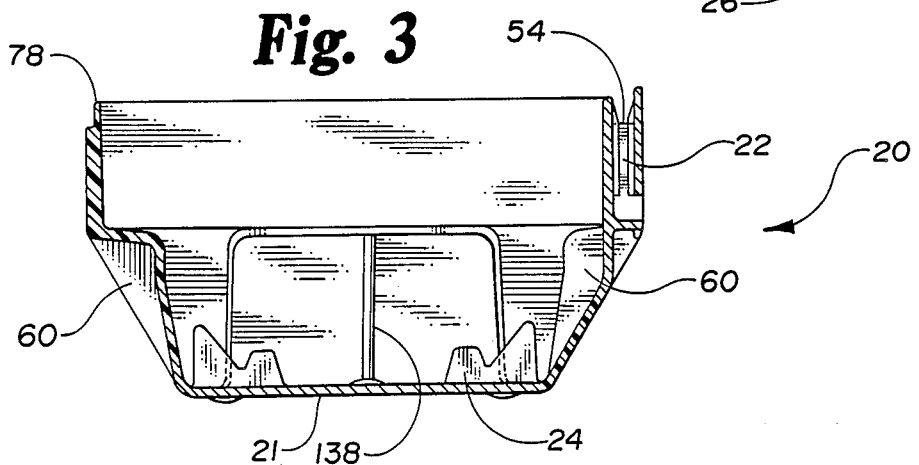
FIG. 3 is a sectional elevation of the shipper base taken along line 3—3 in FIG. 1.

FIG. 1 shows a top plan view of the shipper base 20. FIGS. 2 and 3 each show different sectional elevation views of the shipper base 20. The shipper base 20 includes a generally rectangular floor member 21 with a pair of wafer carrier registration teeth 24 for location of the wafer carrier 30 when the wafer carrier 30 is robotically lowered into position inside the shipper base 20. The four walls 26, 27, 28, and 29 of the shipper base 20 are angled upwardly and slightly outwardly from the floor member 21 to a generally rectangular peripheral rim 54. At each corner of the walls 26, 27, 28 and 29 of the base 20, a corner indentation 50 is formed extending generally vertically from the floor member 21 to about the mid-height of the base 20. Correspondingly, recessed corner niches 60 are formed on the exterior of the base 20, generally conforming to the corner indentations 50, extending from the floor member 21 to about the mid-height of the base 20. From the peripheral rim 54 to about the mid-height of the base 20, the walls 26, 27, 28 and 29 generally conform to the peripheral outline of the generally rectangular rim 54, so that robotic handling ledges 127 are formed at each of the corners at about the mid-height of the base 20. Similarly, in an end wall 28, a bar end indentation 64 extends to the interior of the shipper base 20 from the floor member 21 to about the mid-height of the base 20. On the exterior of the base 20, generally conforming to the bar end indentation 64, is a bar end niche 65, extending from the floor member 21 to about the mid-height of the base 20.

The corner ledges 127 and the bar end ledge 128 are designed to permit the base to be robotically handled. In the embodiment of the drawings, there are latching slots 22a–22n on opposite walls 26, 27 of the shipper base 20 for robotically actuatable latching engagement with latching forks 46 on the shipper cover 40. As has previously been mentioned, the latching arrangement may alternatively be formed with the latch fork 46 on the shipper base 20 and with the latch slots 22 on the shipper cover 40. The central tine 44 of the latch fork 46 may further be provided with a vertical locating rib 134, and the central receiving slot 22 of the latch receiving slots may further be provided with a vertical notch 136, the locating rib 134 cooperating with the vertical notch 136 to assure proper robotic location of the cover 40 over the base 20 for robotic latching. A cover positioning lip 78 extends upwards from the peripheral rim 54 of the shipper base 20.

The corner indentations 50 of the shipper base 20 are designed to serve as reinforcing wedges to prevent warping or bowing of the walls and to maintain the shape of the base under extended usage. Further, the bar end indentations on the shipper base are designed to assure proper one-way alignment of the wafer carrier when it is robotically lowered into the shipper base and of the shipper cover when it is robotically lowered over the carrier and shipper base sub-assembly. Additionally, a vertical rib 138 may be formed on the interior bar end indentation 64 to further assure proper one way alignment of the carrier 30 within the base 20. The bar end indentation assures that the carrier and cover can only be placed in engagement with the base in one direction, so that the first wafer in position in the carrier remains in registrable first position through repeated assembling and disassembling of the components as required during various handling and transportation procedures. The latching arrangement on the present wafer carrier and shipper assembly is designed to be robotically actuated in assembly and disassembly.

Figure 8:
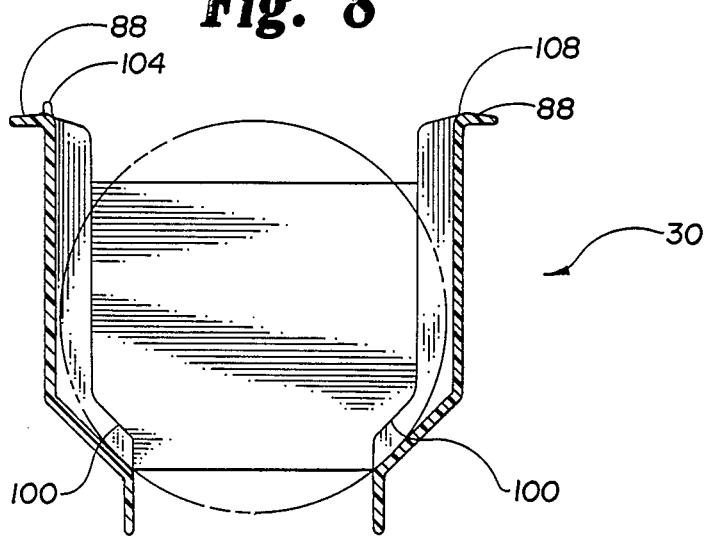
FIG. 8 is a sectional elevation of the carrier taken along line 8—8 in FIG. 7.
Figure 9:
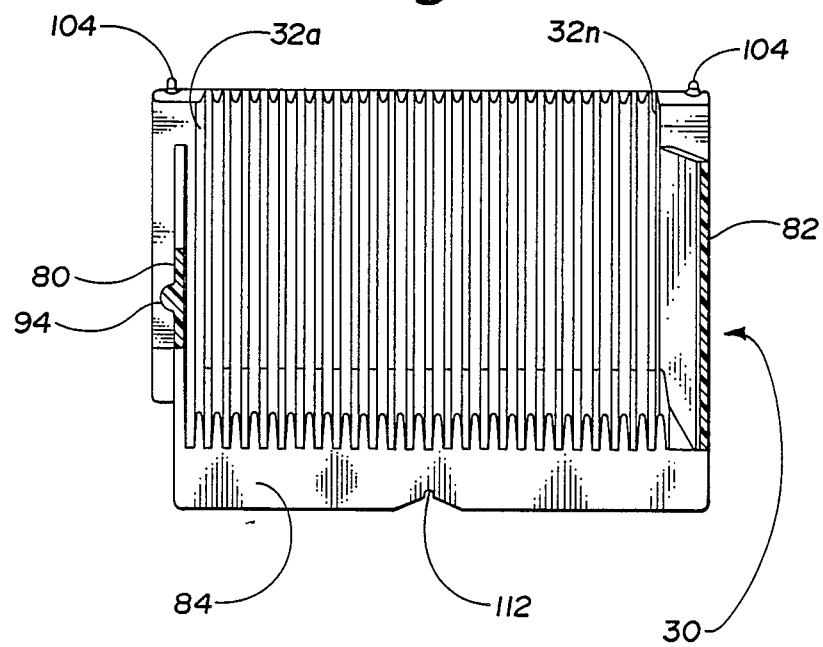
FIG. 9 is a sectional elevation of the carrier taken along line 9—9 in FIG. 7.

FIGS. 4, 5 and 6 show front face 80, rear face 82, and side face 84 elevational views, respectively, of the carrier 30. FIG. 7 is a top plan view of the carrier 30. FIG. 8 is a sectional elevational view of the carrier 30, showing position of supported wafer in phantom line. The carrier 30 includes opposing configured mirror-image faces 84, each of the faces including opposing wafer supporting spacers 32a–32n. An exteriorly projecting bay shaped rear face 82 has a horizontal top edge 88 secured to the side faces 84, an open letter-H configured front face 80 includes a ramped top portion 90 and a rectangular bottom portion 92 generally conforming to the lower shape of the letter-H secured to the side faces 84, and a horizontal rounded cylindrical reinforcing rod 94 is positioned outwardly across the letter-H. Angled outwardly from the outer edges of the front and rear faces 80 and 82, are vertical edge wings 96 and 98, respectively, extending from the top to about the mid-height of the carrier for accessibility to robotic handling and manipulation. At the front face 80, below the edge wings 96 and in line therewith registration bars 130 extend from about the mid-height to the bottom of the carrier 30. These registration bars cooperate with the bar end indentation 64 to assure proper one way alignment of the carrier 30 within the shipper base 20. A plurality of internal opposing wafer supporting spacers 32a–32n partition the carrier 30 for encompassing a plurality of wafers, in cooperation with downwardly extending ramped left and right point wafer supports 100. The top edges of the side faces are angled outwardly. Registration posts 104 and registration holes 108 are provided on the top edges of the carrier 30 for location by robotic handling equipment and manipulation slits 132 are provided for robotically lowering the carrier into and removing the carrier from the shipper base. The bottom edges of the carrier side faces 84 are provided with registration notches 112 for cooperating with registration teeth 24 within the shipper base 20 to assure proper alignment when the carrier 30 is robotically lowered into the shipper base 20.

Figure 10:
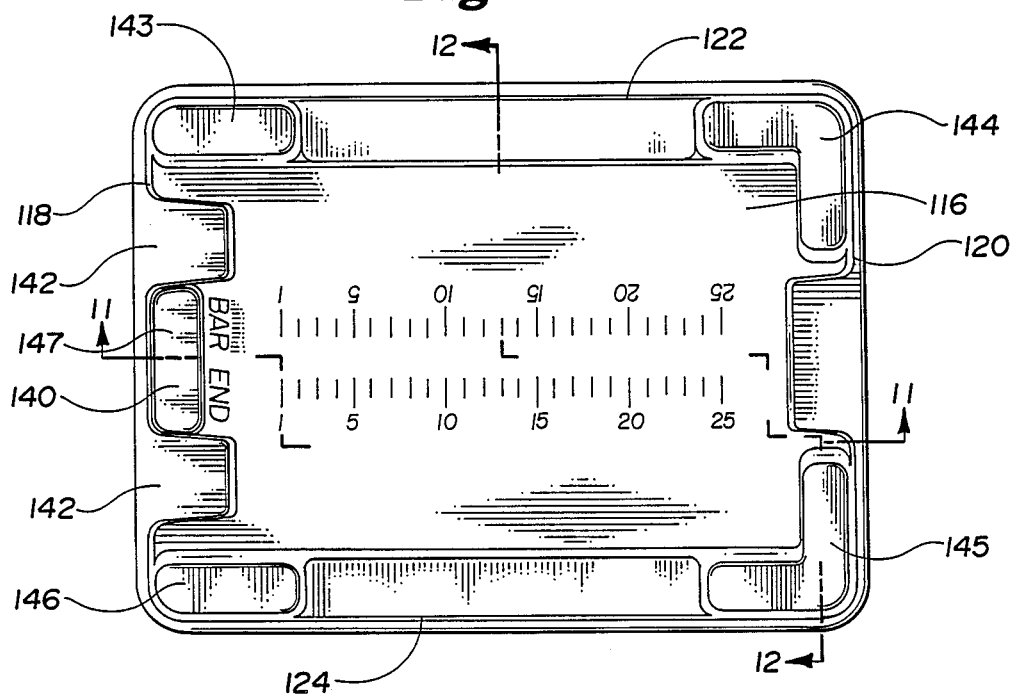
FIG. 10 is a top plan view showing the shipper cover.
Figure 11:
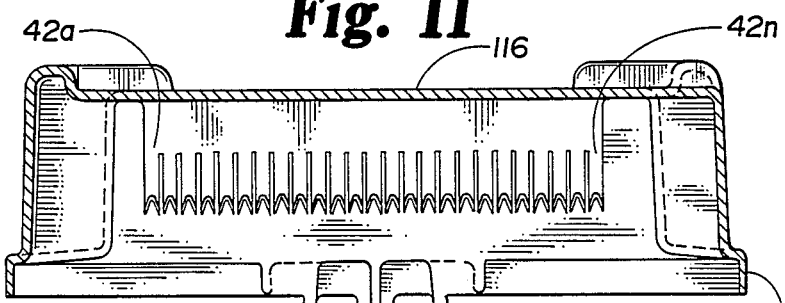
FIG. 11 is a sectional elevation of the shipper cover taken along line 11—11 in FIG. 10.
Figure 12:
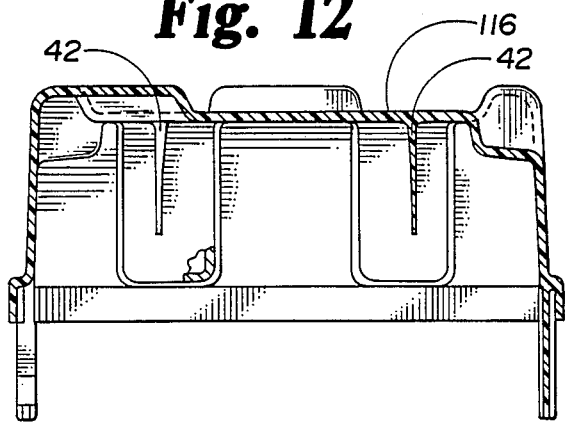
FIG. 12 is a sectional elevation of the shipper cover taken long line 12—12 in FIG. 10.
Figure 16:
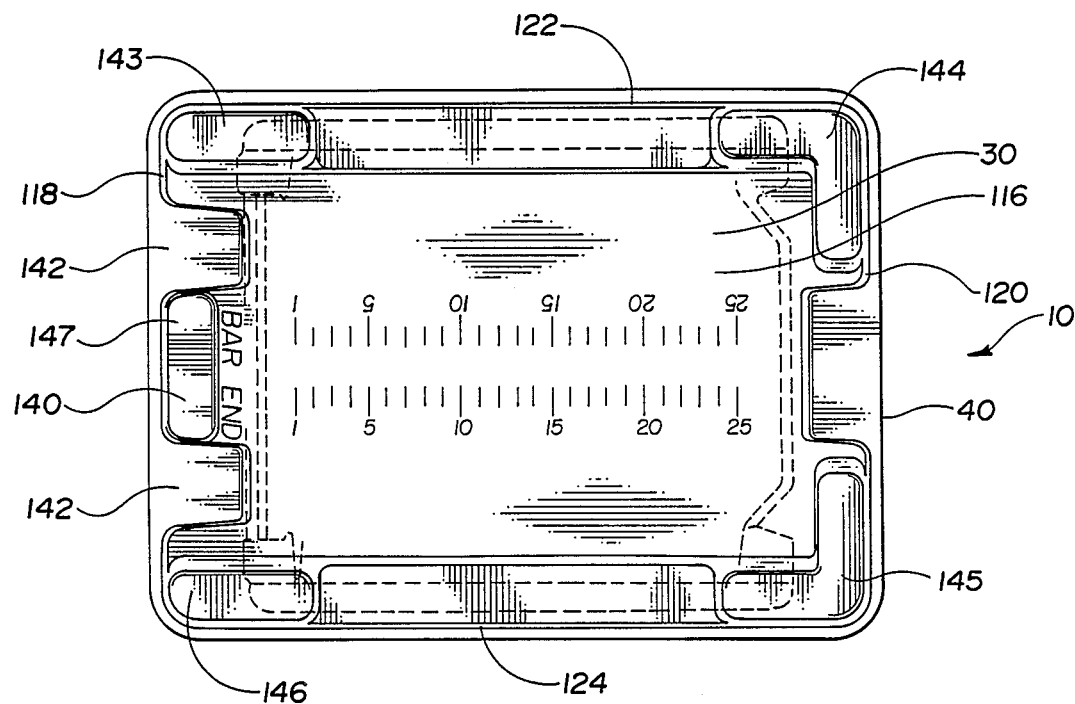
FIG. 16 is a top plan view of the carrier contained within the shipper assembly.

FIG. 10 shows a top plan view of the shipper cover 40. FIGS. 11 and 12 each show different sectional elevations of the cover 40. The shipper cover 40 includes a generally rectangular top member 116 having a parallel pair of rows of downwardly extending wafer engaging and supporting dentate leaves 42a–42n in cooperating alignment with the wafer supporting spacers 32a–32n in the carrier 30. The downwardly extending dentate leaves 42a–42n in each row are separated from each other by slits 117a–117n. The rows of dentate leaves 42a–42n are molded into the top 116 of the shipper cover 40. Four walls 118, 120, 122 and 124 are angled downwardly and slightly outwardly from the top member 116, and robotically actuatable latching forks 46 are on opposite walls in cooperating alignment with the latching slots 22 on the shipper base 20. As has previously been mentioned, the latching arrangement may alternatively be formed with the latch fork 46 on the shipper base 20 and with the latch slots 22 on the shipper cover 40. Note that the latch fork 46 and the base positioning lip 126 form a dust-proof perimeter around the cover on the interior, while providing robotically-accessible lifting indents 150 on the exterior for robotically raising and lowering the cover 40 over the base 20. The base positioning lip 126 extends generally vertically downward from the walls 118, 120, 122 and 124 in cooperating alignment with the cover positioning lip 78 on the shipper base 20. In order to assure proper one-way alignment of the cover 40 over the base 20 containing the carrier 30, in an end wall 118, two bar end indentations 140 extend to the interior of the shipper cover 40. On the exterior of the cover 40, generally conforming to the bar end indentations 140 are bar end niches 142. When the cover 40 is lowered into place over the base 20 containing the carrier 30, the cover 40 will only engage the base 20 when the cover bar end indentations 140 are aligned over the base bar end indentation 64. If the cover 40 is attempted to be engaged with the base 20 containing the carrier 30 the other way around, the position of the carrier 30 will prevent the cover 40 from engaging the base 20. The exterior of the cover member 116 is provided with a series of stacking blisters 143, 144, 145, 146 and 147 to facilitate secure stacking of like packages of the assembled wafer carrier and shipper assembly package.

In operation, a plurality of wafers are loaded into the shipper carrier 30, with the spacers 32a-32n supporting the wafers in upright parallel spaced-apart axial alignment. The loading operation may be advantageously performed by robotic equipment, although any manual or automated procedure is suitable. Manual non-rolling transfer of the wafers from a compatibly designed carrier to the carrier of this invention may be accomplished as described in co-pending application Ser. No. 06/937,680, where compatibly designed carriers and a transfer tray for such operations are described.

The carrier 30 is then lowered into position inside the shipper base 20 by the vertical edge support wings 96, 98 of the carrier 30, with the registration bars 130 of the carrier 30 cooperating with the bar end indentation 64 of the base 20, and the registration notches 112 of the carrier 30 cooperating with the registration teeth 24 of the base 20 to assure proper one-way alignment of the carrier within the base. That is, only the rear face 82 of the carrier will be accommodated by the bar end indentation 64 inside the base 20. Any attempt to insert the carrier 30 into the base 20 the other way around will be prevented by the bay shaped rear face.

To latch the shipper cover 40 to the shipper base 20, the cover 40 is lowered into position over the base 20 so that the wafer locating dentate leaves 42a-42n in the cover 40 engage the wafers. The shipper cover 40 is firmly but gently pressed down over the shipper base 20 until the tines 44a-44n of the latch fork 46 are firmly engaged by each corresponding latch slot 22a-22n. As illustrated by FIGS. 14 and 15, the tine locators 48 urge the tines 44 into a slightly biasing distortion to maintain a latching attachment which remains firm and secure throughout handling and transportation.

A shock absorbing cushioning effect is provided by the shape of the area where the wafers are supported by the carrier in the shipper base in latching engagement with the shipper cover to prohibit transverse and lateral movement of the wafers and to prevent scratching or damaging of the wafers during handling.

There is no point of contact between the walls of the shipper and the carrier. The carrier rests on the floor member 21, stabilized against lateral movement by the action of the registration teeth 24 on the notches 112 of the carrier. Maintaining non-contact of the carrier with the walls of the shipper assures that the impact stress on the wafers in the carrier is substantially damped, especially where the carrier is dropped on either end.

The dentate leaves of the cover operate in conjunction with the other positioning and supporting members in the carrier and shipper base to further stabilize the wafers against relative movement inside the latched assembly.

The wafer carrier and shipper assembly has a smooth exterior to permit a heat shrinkable plastic package to be formed around the shipping assembly or to permit exterior taping of the shipping assembly around the perimeter over the joining between the cover and the base to provide additional structural integrity to the shipper and additional protection against environmental contamination. Since the shipper is intended to provide safe and secure packaging for transportation by common carrier, a package loaded with relatively flexible information storage wafers is designed to withstand normal handling without causing the wafers to be damaged and rendered unusable.

Removal of the shipper cover is accomplished by exerting pressure on the exterior tines 44, as for example by a robotic movable end effecter, tending to urge the tines toward each other. The shipper cover 40 will then "pop up" slightly, due to the release of the slightly biasing spring action of the dentate leaves 42a-42n. The same robotic mechanism which released the tines can then move upward to engage and lift the released cover 40 by the lifting indents 150. Assembly and disassembly of the wafer carrier and shipper assembly of this invention and handling of the individual components is preferably carried out robotically, although it may also be carried out by other suitable manual or automated procedures.

The assembled wafer carrier and shipper assembly packages are designed to be securely stackable with each other. The floor member 21 of the shipper base 20, nests inside the depression on the top member 116 of the cover 40 formed by the stacking blisters 143, 144, 145, 146 and 147. Additionally, the shipper bases and shipper covers are individually nestable for economy of space when empty. Because the wafer carrier and shipper assembly is intended as a reusable container, the individual components are designed to allow for complete drainage of liquids when cleaned in standard equipment.

The wafer carrier and shipper assembly of this invention can be formed to accommodate any size diameter and thickness of wafers. Typical capacities of shippers are designed to accommodate up to 25, up to 30 or up to 50 wafers. The wafer carrier and shipper cover are suitably designed with indicia to indicate the total and actual capacity of the assembly. The wafer carrier and shipper assembly may be formed of any rigid material capable of securely holding and accurately locating the wafers and which is resistant to extremes of temperature, pressure and chemicals. The wafer carrier and shipper assembly may desirably be transparent or translucent to facilitate visual inspection of contents. A suitable material has been found to be a crystalline polymer, as polyethylene, polypropylene or combinations thereof.

What is claimed is:

1. A wafer shipper assembly comprising:
   (a) a shipper base including a generally rectangular floor member having walls angled upwardly and slightly outwardly from the floor to a generally rectangular shaped rim, interior vertical corner indentations, an interior vertical bar indentation in an end wall, exterior recesses generally conforming to the corner indentations and the bar indentation extending from the floor to about the mid-height of the base, the walls generally conforming to the shape of the rim from the rim to about the mid-height of the base, thereby forming exteriorly accessible ledges at each corner of the base at about the mid-height of the base and one part of a two part latching arrangement on each of two opposite walls;
   (b) a generally rectangular carrier including an exteriorly projecting bay shaped rear face and an open letter-H configured front face securing outer edges of mirror-image side faces, interiorly extending wafer supporting spacers in the side faces for supporting a plurality of wafers in upright parallel spaced apart axial alignment, vertical wings angled outwardly from outer edges of the front and rear faces extending up from about the mid-height of the carrier, registration bars on outer edges of the front face extending down from about the mid-height of the carrier; and (c) a shipper cover including a generally rectangular top member having a plurality of wafer engaging and supporting members in cooperating alignment with the wafer supporting spacers in the carrier, four walls angled downwardly and slightly outwardly from the top member and a second part of a two part latching arrangement on each of two on opposite walls in cooperating alignment with said one part of a two part latching arrangement on the shipper base;

so that the wafer carrier is received within the shipper base with registration bars cooperating with the bar end indentation to insure one-way alignment of the wafer carrier within the shipper base, and the shipper cover is received by the shipper base containing the wafer carrier with the wafer supporting members in the cover cooperating with the wafer supporting spacers in the carrier to provide upright parallel spaced apart axial alignment of wafers, and with one part of a two part latching arrangement on the cover cooperating with a second part of a two part latching arrangement on the shipper base to provide latching engagement of the shipper cover with the shipper base containing the wafer carrier, thus providing a secure package for transportation and storage of wafers.

2. The assembly of claim 1 wherein the shipper base is further provided with a cover positioning lip extending upwards from the rim of the shipper base in cooperating alignment with a base positioning lip on the shipper cover extending vertically downward from the walls of the shipper cover.

3. The assembly of claim 1 wherein the shipper base is further provided with registration teeth in the floor member in cooperating alignment with registration notches on bottom edges of the carrier side faces to assure proper alignment when the carrier is lowered into the shipper base.

4. The assembly of claim 1 wherein top edges of the side faces of the carrier are angled outwardly and provided with registration posts and registration holes for robotic alignment of the disk carrier, and manipulation slits are provided in top edges of the side faces of the disk carrier for robotically lowering the carrier into and removing the carrier from the shipper base.

5. The assembly of claim 1 wherein the two part latching arrangement is a latch fork and a set of latch receiving slots.

6. The assembly of claim 5 wherein the latch fork is comprised of tines and the set of latch receiving slots are further provided with tine locators to urge the tines into a slightly biasing distortion when the cover is robotically lowered into position over the base containing the carrier, providing secure latching engagement of the cover with the base containing the carrier.

7. The assembly of claim 1 wherein the wafer engaging and supporting members in the cover are a parallel pair of rows of downwardly extending dentate leaves molded into the top of the carrier.

8. The assembly of claim 1 wherein like assembly packages are securely stackable with each other, with the floor member of the shipper base of a first assembly package nesting inside the depression on the top member of a cover of a second like shipper assembly package.

9. An assembly according to claim 1 wherein shipper covers of the like packages are nestable when empty and shipper bottoms of like packages are nestable when empty.

10. An assembly according to claim 1 wherein the wafer shipper assembly has a smooth exterior for enclosing the disk shipper assembly with shrink wrap or sealing tape.

11. An assembly according to claim 1 wherein the wafer carrier has at least one index notch on the bottom wall thereof constructed and arranged for engaging a cooperative floor member projecting from the floor of the shipper base and wherein the wafer carrier is not otherwise in contact with the shipper base or shipper cover of the wafer shipper assembly.

* * * * *